United States Patent
Rachmady et al.

(10) Patent No.: US 7,354,832 B2
(45) Date of Patent: Apr. 8, 2008

(54) TRI-GATE DEVICE WITH CONFORMAL PVD WORKFUNCTION METAL ON ITS THREE-DIMENSIONAL BODY AND FABRICATION METHOD THEREOF

(75) Inventors: Willy Rachmady, Beaverton, OR (US); Brian S. Doyle, Portland, OR (US); Jack T. Kavalieros, Portland, OR (US); Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/418,295

(22) Filed: May 3, 2006

(65) Prior Publication Data

US 2007/0257325 A1     Nov. 8, 2007

(51) Int. Cl.
*H01L 21/336* (2006.01)
(52) U.S. Cl. ............... 438/283; 438/157; 438/176; 438/142; 438/149; 438/197; 257/330; 257/E21.442
(58) Field of Classification Search ............. 438/283, 438/157, 176, 142, 149, 197; 257/E21.442, 257/330
See application file for complete search history.

(56) References Cited

U.S. PATENT DOCUMENTS

2004/0113171 A1* 6/2004 Chiu et al. .................. 257/119
2005/0156171 A1   7/2005 Brask et al.
2005/0158970 A1   7/2005 Chau et al.
2006/0091428 A1* 5/2006 Yeo et al. ................... 257/213

OTHER PUBLICATIONS

Liu et al. "Advanced FinFET technology: TiN metal-gate CMOS and 3T/4T device integration", 2005 IEEE International SOI Conference, Proceedings, Oct. 3-6, 2005, pp. 219-220.*
U.S. Appl. No. 10/227,068; Title: Tri-Gate Devices and Methods of Fabrication; Inventor: Chau et al.; Filing Date: Aug. 23, 2002.
U.S. Appl. No. 10/750,061; Title: Nonplanar Transistors with Metal Gate Electrodes; Inventor: Brask et al.; Filing Date: Dec. 30, 2003.

* cited by examiner

*Primary Examiner*—Lynne Gurley
*Assistant Examiner*—Hsin-Yi (Steven) Hsieh
(74) *Attorney, Agent, or Firm*—Kathy Ortiz

(57) ABSTRACT

A method of fabricating a tri-gate semiconductor device comprising a semiconductor body having an upper surface and side surfaces and a metal gate that has an approximately equal thickness on the upper and side surfaces. Embodiments of a tri-gate device with conformal physical vapor deposition workfunction metal on its three-dimensional body are described herein. Other embodiments may be described and claimed.

10 Claims, 4 Drawing Sheets

US 7,354,832 B2

TRI-GATE DEVICE WITH CONFORMAL PVD WORKFUNCTION METAL ON ITS THREE-DIMENSIONAL BODY AND FABRICATION METHOD THEREOF

FIELD OF THE INVENTION

The field of invention relates generally to the field of semiconductor integrated circuit manufacturing and more specifically, but not exclusively, relates to complementary metal oxide semiconductor (CMOS) devices having a conformal metal gate structure on a three-dimensional tri-gate fin body.

BACKGROUND INFORMATION

In a conventional metal oxide semiconductor field effect transistor (MOSFET), the source, channel, and drain structures are constructed adjacent to each other within the same plane. The gate dielectric is formed on the channel area and the gate electrode is deposited on the gate dielectric. The transistor is controlled by applying a voltage to the gate electrode thereby allowing a current to flow through the channel between source and drain. The area necessary to support these structures in a plane constrains the number of transistors that can be placed within the limited area of a semiconductor chip. Semiconductor manufacturers increase the packing density of transistors by scaling down the size of the transistor at each generation of technology.

With advances in technology, the physical dimensions of the gate dielectric thickness, the gate length, and the gate oxide thickness have been reduced significantly. Contemporary manufacturing methods currently allow semiconductors to be produced with a transistor gate length of 45 nanometers (nm) and a gate oxide thickness of about 1.2 nm. One conventional gate oxide, silicon dioxide, exhibits reliability issues when only a few atomic layers thick. Additionally, this very thin gate oxide allows leakage current to pass when the device is in an off state, thereby leading to high levels of power consumption and excess heat generation in the semiconductor chip.

Alternative gate dielectric materials have been introduced to help alleviate this problem. However, due to material incompatibility problems, the alternative gate dielectric materials have necessitated a change in gate electrode materials. The polysilicon that has been used as a gate electrode material for many generations is now being replaced with a metal gate. Fabrication of the device using a metal gate instead of a polysilicon gate allows the threshold voltage of a transistor to be better controlled.

An alternative to the standard methods of building planar MOSFETs has been proposed to help alleviate some of the physical barriers to scaling down existing designs. These proposals involve the construction of three dimensional MOSFETs either in the form of a dual-gate transistor (FinFET) or as a tri-gate transistor as a replacement for the conventional planar MOSFET.

Three-dimensional transistor designs such as the dual-gate FinFET and the tri-gate transistor allow tighter packing of the same number of transistors on a semiconductor chip by using vertical or angled surfaces for the gates. The designers use vertical space to accommodate the extra transistor gates, which is analogous to building multi-level buildings as opposed to building single story buildings over a larger plot of land. In a dual-gate FinFET, two gates are oriented along a very narrow strip of silicon known as a fin. The two gates have equivalent lengths because they are located along opposite sides of the fin. The physical size of the fin is typically on the order of 10 nm in width and 50 nm in height. A tri-gate device consists of three gates on a semiconductor body whereby the physical dimensions of the sides of the semiconductor body are equal, resulting in three equivalent transistor gate widths on the same semiconductor body.

Since the tri-gate device has one top gate and two side gates, the overall threshold voltage ($V_t$) of the tri-gate device is a function of the $V_t$ contributed by the top gate and the $V_t$ for each of the two side gates. The $V_t$ of a transistor is a critical parameter in the operation of the transistor. When a voltage is applied to a gate, the electrons in the substrate become concentrated in the region of the substrate nearest the gate creating a depletion region, or a region where the concentration of electrons are equal to the electron holes. If the voltage applied to the gate is below the threshold voltage, the transistor will remain in an off state. If the voltage applied to the gate is above the threshold voltage, then the transistor is turned on and current is allowed to flow from the source to the drain.

The $V_t$ is a function of the materials used for the conductor, such as a polysilicon layer and a metal layer, along with the respective thicknesses of these layers. One problem with the current method of fabricating a tri-gate device is that the $V_t$ for the top gate may be different than the $V_t$ contributed by each of the two side gates. As a result, when a tri-gate device with equal width gates on the top and two sides of the device is scaled, the $V_t$ for the top gate scales differently than the $V_t$ contributed by the two side gates. It would be an advance in the art to construct a tri-gate device whose physical dimensions can be scaled while maintaining an equivalent $V_t$ on all three gates.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION

Embodiments of methods and apparatus for a tri-gate device with a conformal workfunction metal of nearly equivalent thickness on all three gates are described herein. In the following description, numerous specific details are set forth in order to provide a thorough understanding of embodiments of the present invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
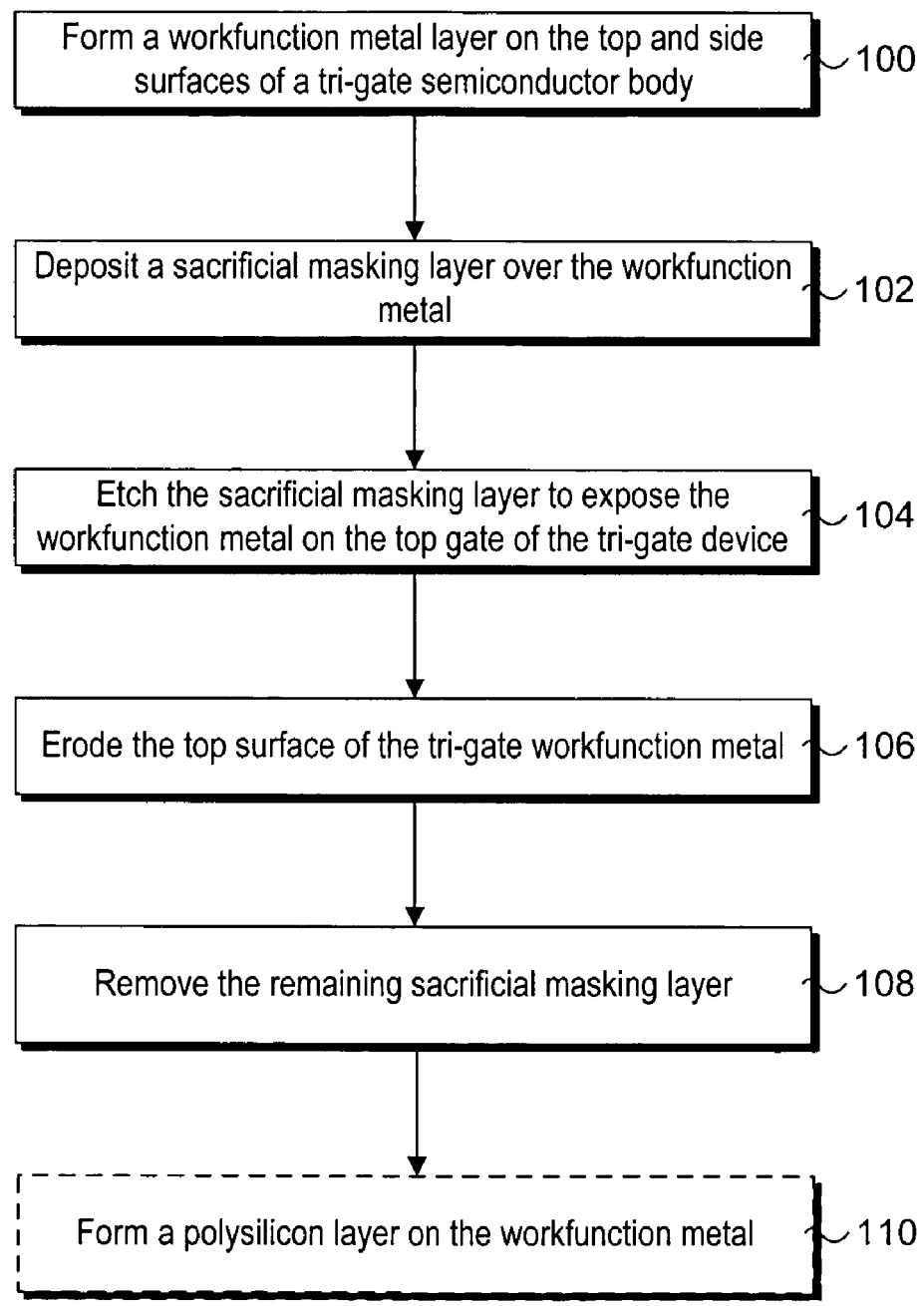
FIG. 1 is a flowchart describing an example fabrication process used to create a workfunction metal with a nearly equivalent metal gate thickness on three surfaces of a tri-gate semiconductor device.

An example for how a conformal metal with a predetermined work function having a nearly equivalent thickness on all three sides of a tri-gate transistor can be formed is described in FIG. 1. A workfunction metal is a metal with a known work function, which is an inherent characteristic of the metal. FIG. 1 describes an embodiment whereby a workfunction metal is formed on three surfaces of a semiconductor body and the workfunction metal on a top surface of the semiconductor body is eroded to create a metal gate on all three surfaces that has a consistent thickness. The process is initiated (element 100) by forming the workfunction metal on the top and two side surfaces of a semiconductor body. The semiconductor body may be formed, for example, from a monocrystalline substrate or from a silicon-on-insulator (SOI) layer. The three surfaces of the semiconductor body may be coated with a thin dielectric layer which may comprise a silicon oxide, or alternatively, a high-k dielectric layer such as lanthanum oxide, tantalum oxide, titanium oxide, hafnium oxide, zirconium oxide, lead-zirconate-titanate (PZT), barium-strontium-titanate (BST), or aluminum oxide. In one embodiment, the high-k dielectric layer is between 15 angstroms and 30 angstroms in thickness, although these values for the dielectric layer are not limiting.

The workfunction metal can be formed using a directional sensitive PVD metal deposition process whereby ions of an inert gas are accelerated towards a workfunction metal target, which may comprise titanium nitride (TiN), tantalum nitride (TaN), or another transition nitride metal. Upon impact, the ions from the inert gas sputter-off a target material and the target material forms on the surface of the tri-gate device in an anisotropic manner. The deposition rate depends on the angle of incidence of incoming particles, resulting in a higher deposition rate on the top gate than the side gates of the tri-gate device. Deposition of the workfunction metal layer using the PVD process is characterized by a microstructure that comprises columnar grains.

In another embodiment, a workfunction metal layer may be formed using anisotropic layering techniques including molecular beam epitaxy (MBE), chemical vapor deposition (CVD), electroplating, or evaporation. In one embodiment, a target thickness of the workfunction metal layer is between 25 angstroms and 300 angstroms in thickness. The workfunction metal layer thickness selected by the device designer is a function of the targeted $V_t$ for the tri-gate device.

After forming the workfunction metal layer, a sacrificial masking layer (element 102) is deposited as a blanket layer. The sacrificial masking layer is applied to mask and planarize vertical features on the wafer. In one embodiment, the sacrificial masking layer may be a thick layer (1100-1500 angstroms) of a sacrificial light absorbing material (SLAM). SLAM is a material that covers the surface of the wafer by filling vias and normalizing a topography, thereby providing a consistent hole-free and opaque surface. The sacrificial masking layer may comprise another organosiloxane film such as bottom anti-reflective coating (BARC) or an organic spin-on coating such as photoresist.

The sacrificial masking material is etched (element 104) to remove a top portion of the material to expose the workfunction metal on the top gate of the tri-gate device. The sacrificial masking material may be dry-etched using sulfur hexafluoride (SF6), octafluorocyclobutane (C4F8), or another fluorocarbon (CxFy) gas in a plasma enhanced chemical vapor deposition (PECVD) chamber. The dry-etch process may be terminated by sensing a workfunction metal surface on the top gate of the tri-gate device. However, the sacrificial masking material may also be eroded using a wet-etch process. In one embodiment, the wet-etch process may comprise HF or hydroxide containing solutions.

The workfunction metal on the top gate of the tri-gate device is eroded (element 106) so that the thickness of the workfunction metal on the top gate is nearly equal to the thickness of the workfunction metal on the two side gates of the tri-gate device. In one embodiment, the workfunction metal on the top gate of the tri-gate device is eroded using sulfur hexafluoride (SF6), octafluorocyclobutane (C4F8), or another fluorocarbon (CxFy) gas in a PECVD chamber. The two side gates are protected from erosion by the sacrificial masking material during this process and maintain their initial thickness. As a result, the thickness of the workfunction metal on the two side gates of the tri-gate device are left unchanged. Other erosion techniques may be employed to achieve equivalent results. Examples may include wet-etch, chemical mechanical polishing (CMP) or ion milling techniques.

The remaining sacrificial masking material may be stripped or removed (element 108) once a desired workfunction metal thickness has been achieved on the top gate of the tri-gate device. In one embodiment, the remaining SLAM material is removed using an aqueous buffered hydrogen fluoride (HF) stripping solution. The stripping solution should selectively remove the sacrificial masking material without eroding a material amount of the workfunction metal.

After removing the remaining sacrificial masking material, the workfunction metal is clean and free of polymer residue and a top surface of the workfunction metal is suitable for further processing. In one embodiment, a polysilicon layer may be deposited on the top surface of the workfunction metal. A polysilicon layer may be deposited to create a vertical or nearly vertical wall adjacent to a side gate of a tri-gate device. A polysilicon layer may also be deposited to protect the workfunction metal (element 110) from interacting with an atmosphere or during subsequent processing steps that would be harmful to a workfunction metal surface.

Figure 2:
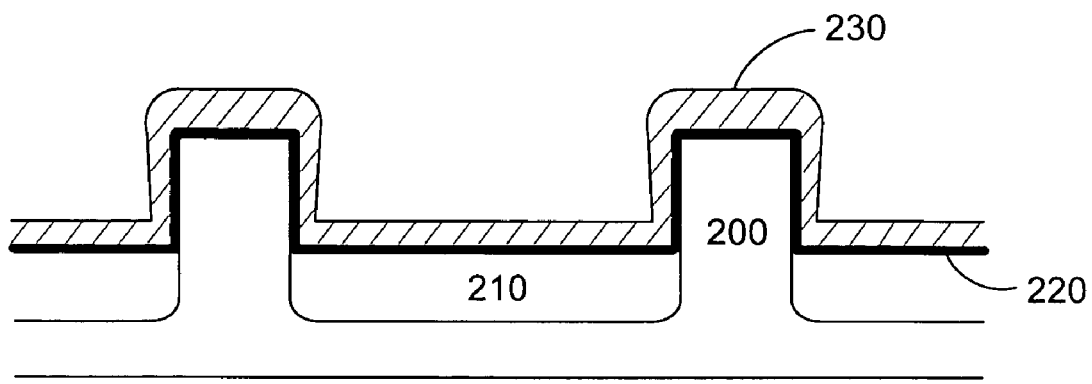
FIG. 2 is an illustration of a cross-sectional view of two tri-gate devices after forming a physical vapor deposition (PVD) workfunction metal.

In one embodiment, a workfunction metal formed as a top gate of a tri-gate transistor is noticeably thicker than the workfunction metal formed as two side gates, as illustrated in FIG. 2. A semiconductor body 200 constructed from a silicon substrate is formed to create gate regions that are separated by a silicon dioxide layer 210. A gate dielectric layer 220 covers the silicon dioxide layers 210 and the gate regions. A workfunction metal 230 is then formed on the gate dielectric layer 220. The workfunction metal 230 may be a metal film such as tungsten, tantalum, titanium and/or nitrides and alloys thereof. For n channel-type transistors, the workfunction metal 230 provides a work function in the range of 3.9 to 4.6. For the p channel-type transistors, the workfunction metal 230 provides a work function of 4.6 to 5.2 eV. Accordingly, for substrates with both n channel and p channel transistors, two separate metal deposition processes may need to be used.

The workfunction metal 230, such as TiN is formed as a layer on the surface of the dielectric layer 220 on all three gates of the tri-gate device. The TiN layer may be formed by using physical vapor deposition (PVD), atomic layer deposition (ALD), molecular beam epitaxy (MBE), chemical vapor deposition (CVD), electroplating, or evaporation.

Figure 3:
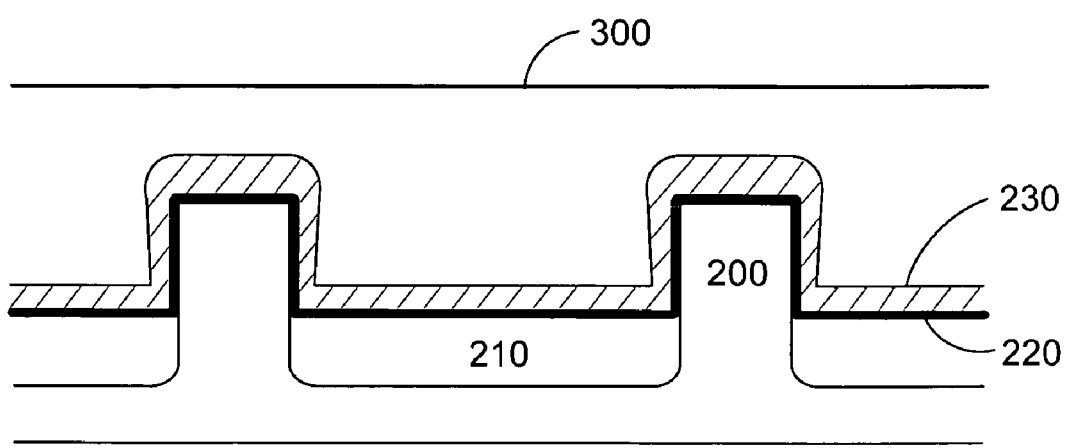
FIG. 3 is an illustration of the structure of FIG. 2 with a sacrificial masking layer deposited as a blanket layer.

After forming the workfunction metal layer 230, a sacrificial masking layer 300 is deposited as a blanket layer as illustrated in FIG. 3. The sacrificial masking layer 300 is applied to mask and planarize the vertical features. In one embodiment, the sacrificial masking layer 300 may be a SLAM layer with a thickness of 1100 angstroms to 1500 angstroms. The sacrificial masking layer 300 may also be a organosiloxane layer such as bottom anti-reflective coating (BARC) or an organic spin-on coating such as photoresist.

Figure 4:
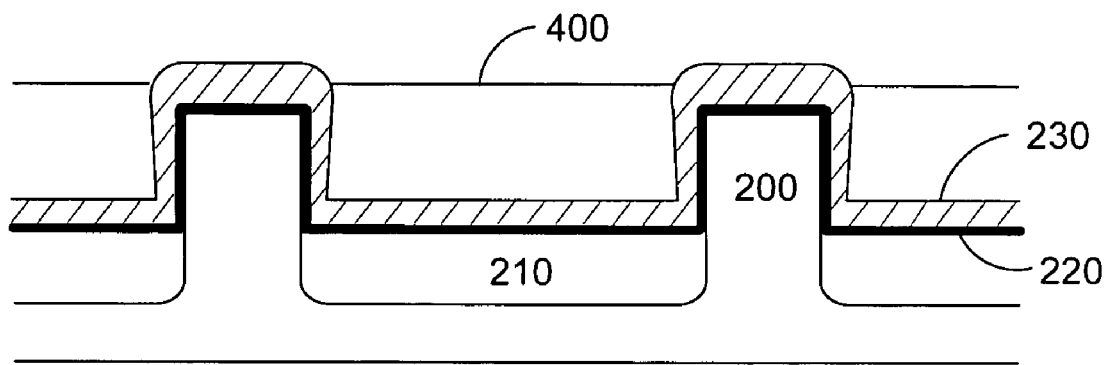
FIG. 4 is an illustration of the structure of FIG. 3 with a top portion of the sacrificial masking layer removed to expose a top surface of the workfunction metal on a top gate.

A top portion 400 of the sacrificial masking layer 300 is removed to reveal the workfunction metal 230 on the top gate of the tri-gate device, as shown in FIG. 4. The sacrificial masking layer 300 is eroded, resulting in a surface 400 that is below a top surface of the workfunction metal 230 on a top gate of the tri-gate device. In one embodiment, the sacrificial masking layer 300 may be dry-etched using sulfur hexafluoride (SF6) in a PECVD chamber.

Figure 5:
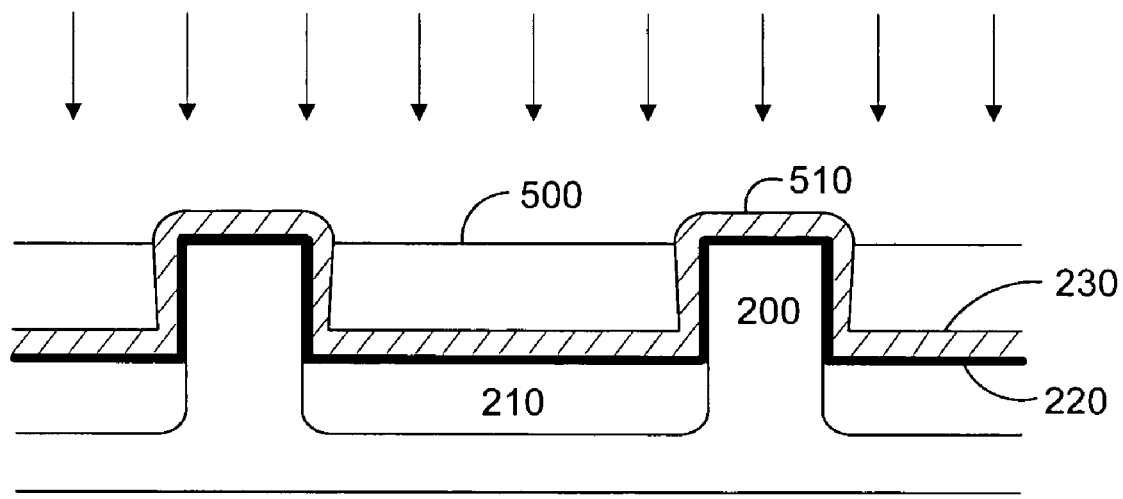
FIG. 5 is an illustration of the structure of FIG. 4 with a thinned workfunction metal on the top gate.

After etching a top portion of the sacrificial masking layer 300, the workfunction metal 230 on the top gate of the tri-gate device is eroded, as illustrated in FIG. 5, so that the thickness of the workfunction metal 230 on the top gate is nearly equivalent to the thickness of the workfunction metal 230 on two side gates of the tri-gate device. An upper surface of the sacrificial masking layer 500 may be minimally eroded depending on the process used to etch the workfunction metal 230 on the top gate. For instance, if a dry-etch process is used to erode the workfunction metal 230 on the top gate, the etch process may also consume a small amount of an upper portion of the sacrificial masking layer 500. The amount removed is dependent on the selectivity of the etch chemistry. Once eroded, a thickness of the workfunction metal 230 on the top gate 510 of the tri-gate device will be nearly equivalent to the thickness of the two side gates. In one embodiment, the thickness of the workfunction metal 230 on the top gate of the tri-gate device will match the thickness of the workfunction metal 230 on the two side gates of the tri-gate device within a maximum deviation of +/−10%.

Figure 6:
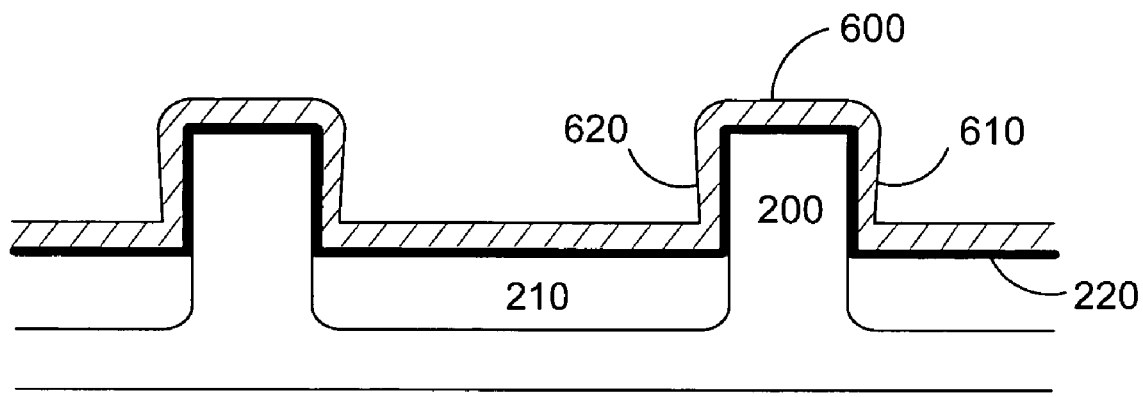
FIG. 6 is an illustration of the structure of FIG. 5 with the remaining sacrificial masking layer removed.

FIG. 6 illustrates an embodiment after the sacrificial masking layer 300 has been stripped from the workfunction metal 600. In one example, the thickness of the workfunction metal 600 on the top gate of the tri-gate device may be nearly equivalent to the thickness of side gates 610 and 620.

Figure 7:
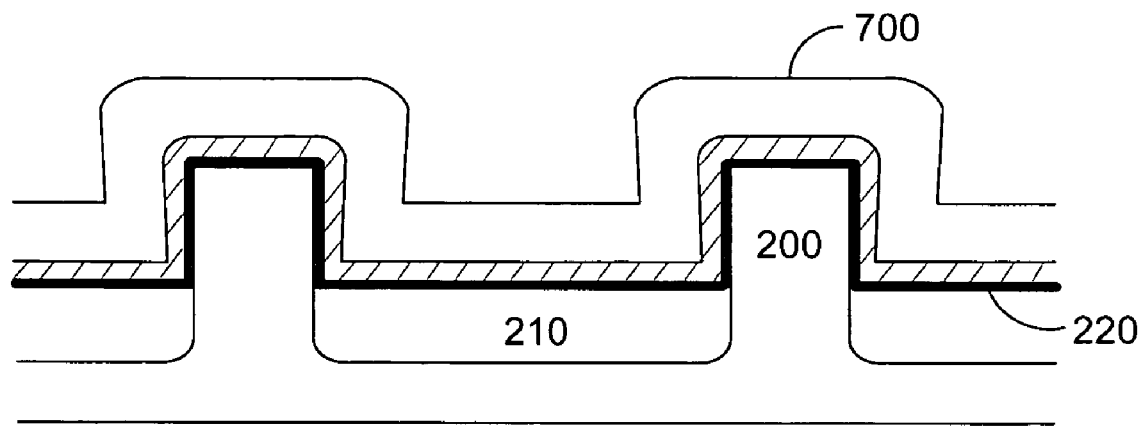
FIG. 7 is an illustration of the structure of FIG. 6 with a polysilicon layer deposited on the thinned workfunction metal.

FIG. 7 illustrates another embodiment where a polysilicon layer 700 is deposited on a workfunction metal of a tri-gate device with a workfunction metal layer that has a nearly equivalent thickness on a top surface and two side surfaces of a semiconductor body. The polysilicon layer 700 is normally doped for reduced resistance and is used to create a conductive path to the workfunction metal 600. The polysilicon layer 700 may be deposited to create a vertical or nearly vertical wall adjacent to a side gate of a tri-gate device. The thickness of the polysilicon layer 700 may range for example from a minimum of 400 angstroms and a maximum of 1200 angstroms. The polysilicon layer 700 may be doped or un-doped and can be used to protect the workfunction metal 600 from interaction with an atmosphere or during subsequent processing steps that would be harmful to the workfunction metal surface. For example, a subsequent processing step may contain aqueous acids, bases, or oxidizers that would erode or modify the surface of the workfunction metal.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method for fabricating a transistor comprising:
   depositing a metal gate having an upper layer and two side layers with a directional sensitive metal deposition process such that the upper layer is thicker than the side layers;
   masking the metal gate with a masking layer so as to expose the upper layer; and
   eroding the upper layer such that the thicknesses of the upper layer and the side layers are approximately equal, wherein the two side layers are positioned on two sides of a Fin body region and serve as two side gates of the transistor, and the remaining upper layer is positioned atop the Fin body region and serves as a top gate of the transistor; and,
   said top gate and said two side gates exhibit a substantially equivalent threshold voltage for the transistor.

2. The method of claim 1, wherein the masking layer employs a siloxane-based polymer.

3. The method of claim 2, wherein the siloxane-based polymer comprises a sacrificial light absorbing material or a bottom anti-reflective coating.

4. The method of claim 1, wherein the metal gate comprises at least one of titanium or a transition nitride metal.

5. The method of claim 4, wherein the transition nitride metal comprises titanium nitride or tantalum nitride.

6. The method of claim 1, wherein the upper layer of the metal gate is eroded using a dry-etch process or a wet-etch process.

7. The method of claim 1, wherein the upper layer of the metal gate is eroded using at least one of a chemical mechanical polishing process or an ion milling process.

8. The method of claim 1, wherein a dielectric layer is deposited prior to the deposition of the metal gate.

9. The method of claim 8, wherein the dielectric layer comprises at least one of a silicon oxide, lanthanum oxide, tantalum oxide, titanium oxide, hafnium oxide, zirconium oxide, lead-zirconate-titanate, barium-strontium-titanate, or aluminum oxide.

10. The method of claim 1 further comprising depositing polysilicon on the upper layer and the side layers of the metal gate.

* * * * *